United States Patent
Tang et al.

(10) Patent No.: US 10,134,660 B2
(45) Date of Patent: Nov. 20, 2018

(54) SEMICONDUCTOR DEVICE HAVING CORRUGATED LEADS AND METHOD FOR FORMING

(71) Applicant: NXP USA, INC., Austin, TX (US)

(72) Inventors: Jinbang Tang, Chandler, AZ (US); Aruna Manoharan, Chandler, AZ (US); Norman Lee Owens, Sun Lakes, AZ (US); Gary Carl Johnson, Tempe, AZ (US)

(73) Assignee: NXP USA, Inc., Austin, TX (US)

( * ) Notice: Subject to any disclaimer, the term of this patent is extended or adjusted under 35 U.S.C. 154(b) by 0 days.

(21) Appl. No.: 15/468,058

(22) Filed: Mar. 23, 2017

(65) Prior Publication Data

US 2018/0277464 A1   Sep. 27, 2018

(51) Int. Cl.
*H01L 23/495* (2006.01)
*H01L 23/31* (2006.01)
*H01L 21/48* (2006.01)
*H01L 21/56* (2006.01)

(52) U.S. Cl.
CPC .... *H01L 23/49524* (2013.01); *H01L 21/4825* (2013.01); *H01L 21/4828* (2013.01); *H01L 21/4842* (2013.01); *H01L 21/56* (2013.01); *H01L 23/3107* (2013.01); *H01L 23/4951* (2013.01); *H01L 23/4952* (2013.01)

(58) Field of Classification Search
CPC ......... H01L 23/49544; H01L 23/49541; H01L 23/495; H01L 23/49575; H01L 23/49582; H01L 23/49861

USPC .......... 257/666, 676; 438/111, 112, 123, 124
See application file for complete search history.

(56) References Cited

U.S. PATENT DOCUMENTS

| | | | |
|---|---|---|---|
| 6,559,526 B2 * | 5/2003 | Lee | H01L 23/49513 257/666 |
| 6,617,197 B1 | 9/2003 | Bayan et al. | |
| 6,838,751 B2 | 1/2005 | Cheng et al. | |
| 7,132,733 B2 * | 11/2006 | Itou | H01L 21/4828 257/666 |
| 7,375,416 B2 | 5/2008 | Retuta et al. | |
| 8,404,524 B2 * | 3/2013 | Camacho | H01L 21/4832 257/666 |
| 8,659,131 B2 * | 2/2014 | Kim | H01L 21/4832 257/666 |
| 9,029,992 B2 * | 5/2015 | Kim | H01L 21/56 257/666 |
| 2010/0044843 A1 * | 2/2010 | Chang Chien | H01L 21/4832 257/676 |
| 2010/0072591 A1 * | 3/2010 | Camacho | H01L 21/4832 257/676 |

(Continued)

*Primary Examiner* — S. V. Clark

(57) ABSTRACT

A semiconductor device includes a lead frame site including a die attach region and corrugated metal leads around the die attach region. Each of the corrugated metal leads includes two or more corrugations. Each of the two or more corrugations includes a first flat horizontal portion, a first vertical portion with a first end directly adjacent and connected to a first end of the first flat horizontal portion, a second flat horizontal portion with a first end directly adjacent and connected to a second end of the first vertical portion, and a second vertical portion with a first end directly adjacent and connected to a second end of the second flat horizontal portion. The first flat horizontal portion is in a different plane than the second flat horizontal portion.

21 Claims, 3 Drawing Sheets

(56) References Cited

U.S. PATENT DOCUMENTS

2011/0227208 A1   9/2011   Kim et al.
2012/0038036 A1   2/2012   Chun et al.

* cited by examiner

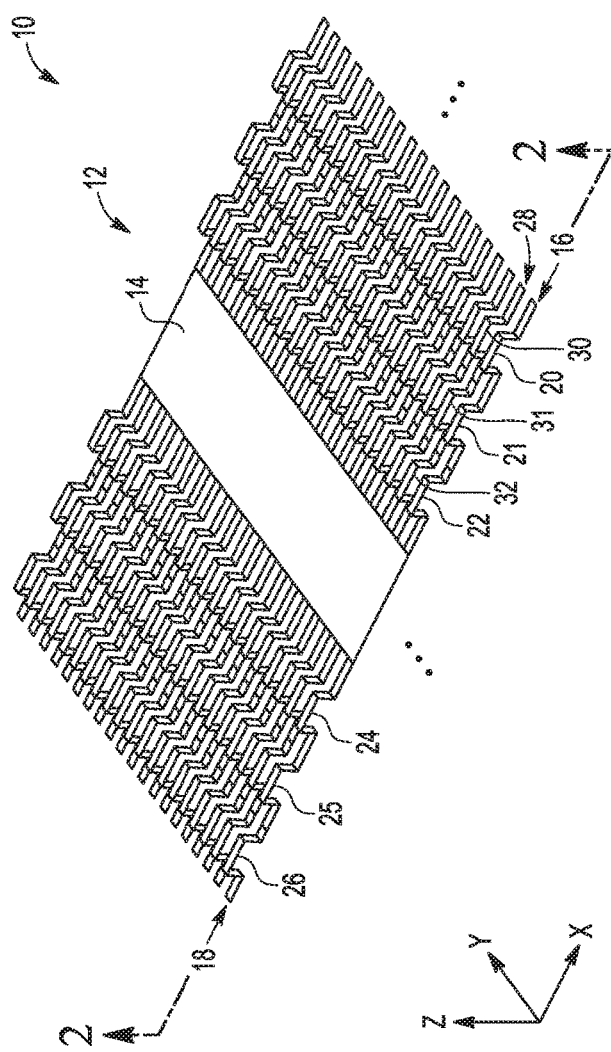
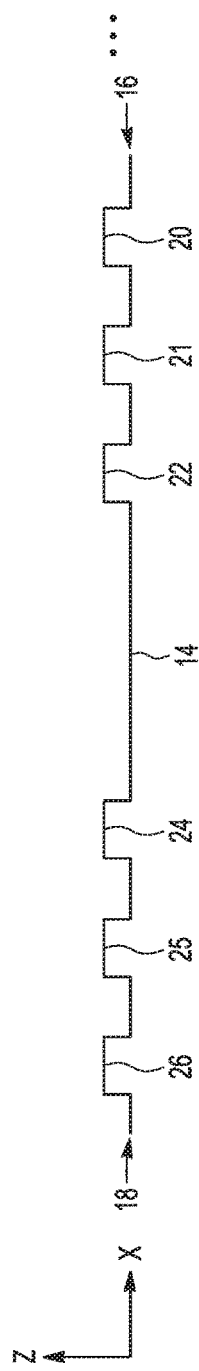
FIG. 1
FIG. 2

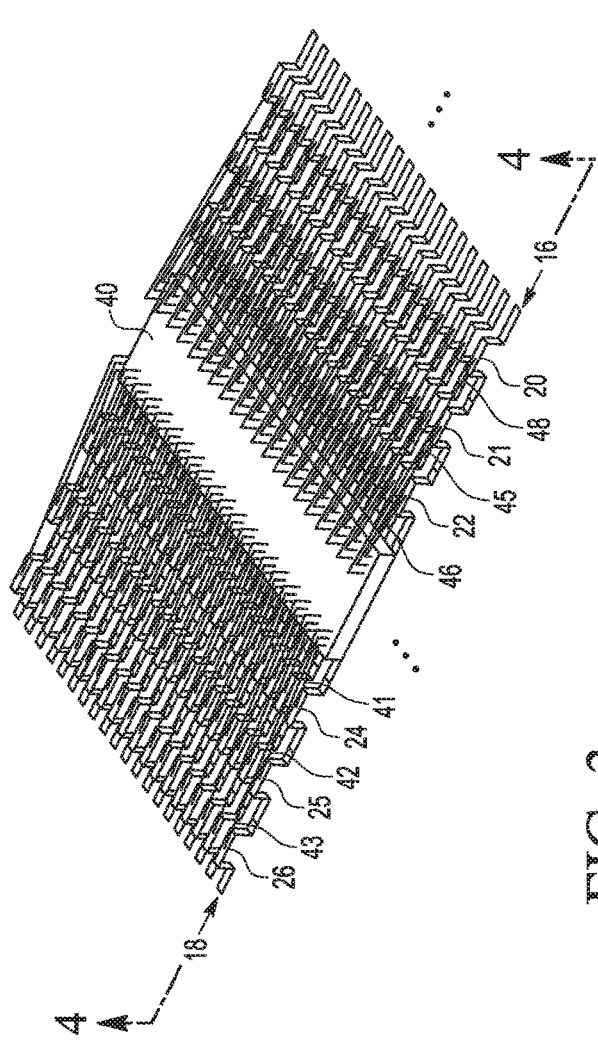
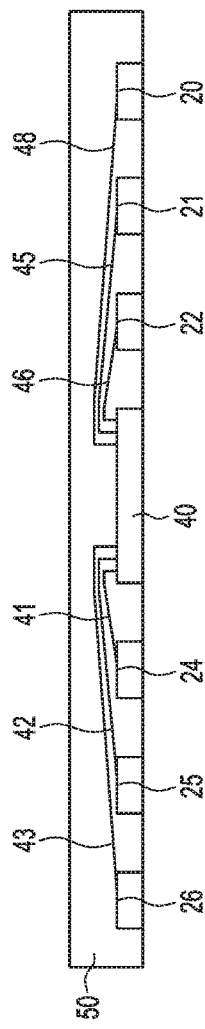
FIG. 3
FIG. 4

SEMICONDUCTOR DEVICE HAVING CORRUGATED LEADS AND METHOD FOR FORMING

BACKGROUND

Field

This disclosure relates generally to semiconductor packaging, and more specifically, to a semiconductor device having corrugated leads and method for forming.

Related Art

Conventional lead frames for surface mount packaging are becoming increasingly limiting as the numbers of input/output pads of a semiconductor die increases. With conventional lead frames, each lead is wire bonded to an I/O pad of the semiconductor die or directly connected to the fie flag. Therefore, the number of I/Os that can be accommodated largely depends on the ability to create a greater number of leads around the die. However, increasing the number of leads around the die also increases the size of the packaged die or shrinks the size of the leads, which is undesirable. Therefore, a need exists for an improved lead frame for surface mount packaging capable of handling an increased number of I/Os while minimally impacting the size of the resulting package.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

FIG. 1 illustrates a perspective view of a lead frame in accordance with one embodiment of the present invention.

FIG. 2 illustrates a cross-section view of the lead frame of FIG. 1.

FIG. 3 illustrates a perspective view of the lead frame of FIG. 1 at a subsequent stage of processing, in accordance with one embodiment of the present invention.

FIG. 4 illustrates a cross-sectional view of the lead frame of FIG. 3.

DETAILED DESCRIPTION

Figure 5:
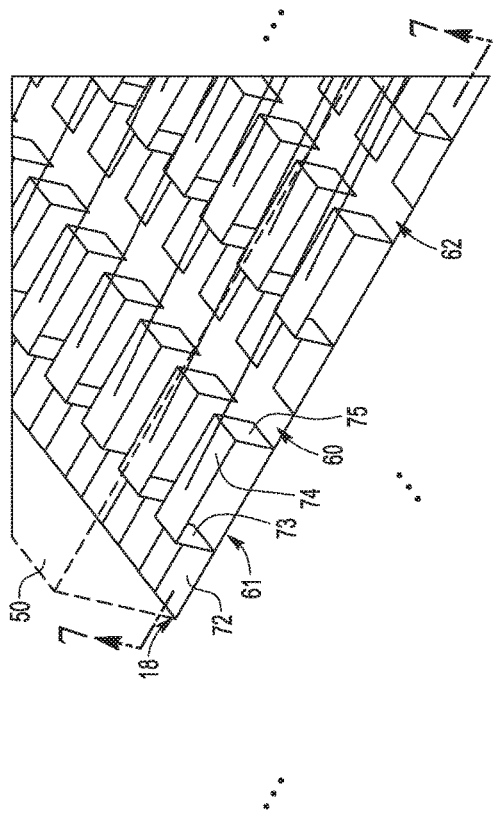
FIG. 5 illustrates another perspective view of the lead frame of FIG. 3.

A lead frame having an array of lead frame sites is formed in which each lead frame site has a flag portion and corrugated leads extending from the flag portion, in which each corrugated lead includes a plurality of corrugations. A semiconductor die is attached to the flag portion of each lead frame site, and wire bonds are formed extending from each corrugation to I/O pads on the semiconductor die of the lead frame site. In this manner, the number of wire bonds extending from each corrugated lead to the semiconductor die equals the number of corrugations of the lead. That is, one wire bond connects each corrugation with a corresponding I/O pad. The lead frame is then encapsulated, after which portions of each lead are removed to physically separate the corrugations of each lead. The lead frame is then singulated to form individual lead frame surface mount packages. In this manner, an increased number of wire bond connections may be achieved within a package without impacting package size.

FIG. 1 illustrates a lead frame 10 in accordance with one embodiment of the present invention. Lead frame 10 includes an X by Y array of lead frame sites, in which lead frame site 12 is illustrated in more detail in FIG. 1. X and Y can each be any integer number greater than or equal to one. Lead frame site 12 includes a flag portion 14 (also referred to as a die attach region) and a plurality of corrugated leads (also referred to as fingers) extending from opposite sides of flag portion 14, including corrugated leads 18, 16, and 28. Lead frame 10 is a metal lead frame, formed of, for example, copper. The leads of adjacent lead frame sites, in the x direction, are connected to each other, and the flag portions of adjacent lead frame sites, in the y direction, may be connected to each other. Note that each lead frame site will be separated from each other during singulation at the end of the packaging process.

Initially, each lead of lead frame 10 is a straight, flat metal lead extending from each side of a corresponding flag portion. Lead frame 10 is then processed using a forming tool to result in the corrugated leads of FIG. 1. The forming tool forms corrugations in each lead, in which each corrugation is still a continuous part of the metal lead and extends a positive distance in the z direction as compared to the flat lead prior to the corrugation formation. For example, at the current stage in processing, lead 18 is a continuous lead with corrugations 24, 25, and 26, and lead 16 is a continuous lead with corrugations 20, 21, and 22. Similarly, lead 28 is a continuous lead with corrugations 30, 31, and 32. Therefore, after the forming tool, site 12 includes corrugated leads around at least two sides of flag portion 14 of site 12. In the illustrated embodiment, the corrugations extend from two opposite sides of flag portion 14. In one embodiment, the corrugations of each lead are in a straight line along an axis parallel to the x axis.

Note that the corrugations of each lead on one side of flag portion 14 may line up with each other in the x direction, as illustrated in FIG. 1. For example, corrugation 30 lines up with corrugation 20, corrugation 31 lines up with corrugation 21, and corrugation 32 lines up with corrugation 22. However, in alternate embodiments, the corrugations of neighboring leads may not line up but be staggered, either partially or completely, in the horizontal plane. In yet another embodiment, one or more leads may not be corrugated and thus remain flat. Also, in the illustrated embodiment, the corrugated leads extend from two opposite sides of the flag portion, but alternatively, may extend from each of the 4 sides of the flag portion. Alternatively, the corrugated leads may extend from a single side of the flag portion.

FIG. 2 illustrates a cross-section view of lead frame 10 which includes lead 18 with corrugations 24-26 and lead 16 with corrugations 20-22. Each corrugation has a horizontal flat portion physically connected between two vertical portions of the lead. In the illustrated embodiment, all the corrugations are at the same height. That is, the horizontal portions of the corrugations are at the same height, as measured in the z direction. However, in other embodiments, the corrugations may be at different heights or levels. Also, in the illustrated embodiment, the corrugations of each lead are spaced equally apart, but may be spaced differently in alternate embodiments. Also, each lead may include a different number of corrugations than the three illustrated in FIG. 1. Furthermore, different leads within the same lead frame site may include a different number of corrugations.

As mentioned above, one or more leads of a lead frame site may include 0 corrugations, i.e. remain flat.

FIG. 3 illustrates a perspective view of lead frame 10 of FIG. 1 at a subsequent stage in processing. A semiconductor die 40 is attached to flag portion 14 of site 12. In one embodiment, a die attach material may be used to attached die 40 to lead frame 10. After attaching die 40, wire bonds are formed between the leads and I/O pads (i.e. bond pads) on a top surface of die 40. A wire bond is formed between each corrugation and an I/O pad of die 40. For example, wire bond 41 is formed coupling corrugation 24 to die 40, wire bond 42 is formed coupling corrugation 25 to die 40, and wire bond 43 is formed coupling corrugation 26 to die 40. Similarly, wire bond 44 is formed coupling corrugation 20 to die 40, wire bond 45 is formed coupling corrugation 21 to die 40, and wire bond 46 is formed coupling corrugation 22 to die 40. In one embodiment, wire bond 43 is taller than wire bonds 42 and 41, and wire bond 44 is taller than wire bonds 45 and 46. The flat horizontal portion of each corrugation is sufficiently large to contain at least on wire bond connection. Note that the wire bonds can be formed using known wire bonding techniques. At this point, each lead of each array site is still a continuous metal.

In the illustrated embodiment, one wire bond is formed between each corrugation and a corresponding I/O pad of die 40. Note that, in alternate embodiments, a corrugation may have more than one wire bond connection to multiple I/O pads of die 40. Also, note that an I/O pad of die 40 can have multiple wire bonds as well.

FIG. 4 illustrates a cross-sectional view of lead frame 10 at a subsequent stage in processing. After the wire bond connections are formed, a mold compound 50 is applied to lead frame 10 to encapsulate all the die and wire bonds attached to all lead frame sites of lead frame 10. This may be done through film assisted molding or other known molding techniques. Mold compound 50 surrounds die 40 and the wire bonds, such as wire bonds 41-43 and 44-46. However, mold compound 50 exposes the leads on a bottom surface of encapsulated lead frame 10.

Note that in the illustrated embodiments, a single die, such as die 40, is attached to each flag portion of lead frame 10. In alternate embodiments, multiple die can be attached to the flag portion of each lead frame site. In this case, in each frame array site, wire bonds would be formed between the corrugations and I/O pads of the multiple die.

FIG. 5 illustrates a perspective view of lead frame 10 of FIG. 4, in further detail. At this point, the leads, such as lead 18, are continuous metal leads. Portions of each lead, such as portions 52 and 54 and portions 56 and 58, will be subsequently removed in order to physically separate and electrically isolate the corrugations.

Figure 6:
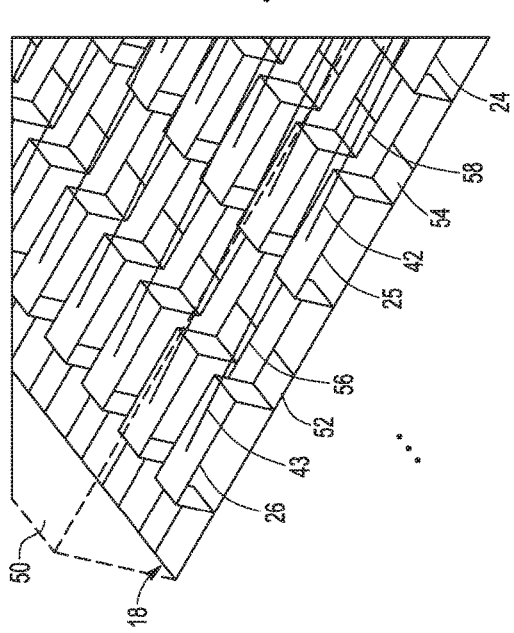
FIG. 6 illustrates a perspective view of the lead frame of FIG. 5 at a subsequent stage of processing, in accordance with one embodiment of the present invention.

FIG. 6 illustrates a perspective view of lead frame 10 at a subsequent stage in processing. The bottom surface 61 of encapsulated lead frame 10 is processed to remove portions of each lead, such as portions 52, 54, 56, and 58, to form separations in each lead. For example, the removal of portion 52 from lead 18 results in lead opening or separation 60, and the removal of portion 54 from lead 18 results in lead opening or separation 62. As a result, each corrugation of a lead is physically separate. For example, corrugation 26 is physically separate from corrugation 25, which is physically separate from corrugation 24. Also note that portions of the leads are removed to physically separate the leads of a site from the flag portion of a site. Each resulting physically separate corrugation includes a first horizontal portion 72 which is at a first height, a second horizontal portion 74 which is at a second height higher than the first height, and two vertical portions 73 and 75. Note that vertical portion 73 is continuous between portions 72 and 74. That is, horizontal portion 72, vertical portion 73, horizontal portion 74, and vertical portion 75 are continuous and thus physically connected. Also, vertical portions 73 and 75 do not have to be perpendicular but can ramp at different angles between the lower horizontal portions and higher horizontal portions. Also, in other embodiments, portion 75 may also be removed. The removal of the lead frame portions may be performed with a variety of methods, including laser, chemical, or mechanical methods. For example, a patterned masking layer may be applied to bottom surface 61 where the desired portions are removed by etching. Alternatively, stamping, a saw, or a laser may be used to remove the lead portions.

Figure 7:
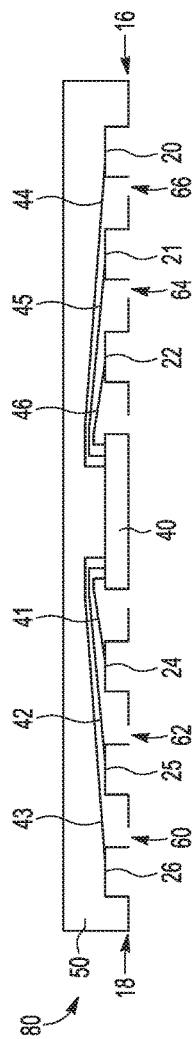
FIG. 7 illustrates a cross-sectional view of the lead frame portion of FIG. 6 after singulation, in accordance with one embodiment of the present invention.

FIG. 7 illustrates a cross-section view of lead frame site 12 of FIG. 6 at a subsequent stage in processing. After physically separating the corrugations (such that the signal net I/Os can be physically isolated from each other), lead frame 10 is singulated such that each lead frame site corresponds to a resulting packed device, such as packaged device 80. Device 80 is a surface mount lead frame packaged device with corrugated leads.

Therefore, by now it can be appreciated how corrugated leads can be used to form a surface mount packaged device which allows for two or more wire bonds to extend from each corrugated lead to one or more die within a single package. In this manner, lead frames with corrugated leads may allow for an increased number of I/O pads on the semiconductor die as compared to traditional lead frames.

Because the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Although the invention is described herein with reference to specific embodiments, various modifications and changes can be made without departing from the scope of the present invention as set forth in the claims below. For example, the corrugations may be at different locations along a lead. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

The following are various embodiments of the present invention.

In one embodiment, a semiconductor device includes a lead frame site including a die attach region and corrugated metal leads around the die attach region, wherein each of the corrugated metal leads includes two or more corrugations, and each of the two or more corrugations includes: a first flat horizontal portion, a first vertical portion with a first end directly adjacent and connected to a first end of the first flat horizontal portion, a second flat horizontal portion with a first end directly adjacent and connected to a second end of the first vertical portion, and a second vertical portion with a first end directly adjacent and connected to a second end of the second flat horizontal portion, wherein the first flat horizontal portion is in a different plane than the second flat horizontal portion. In one aspect of the above embodiment, the corrugated leads are around at least two sides of the die attach region. In another aspect, the device further includes a semiconductor die on the die attach region. In a further aspect, the device further includes a first wire bond having a first end connected to a first bond pad on the semiconductor die and a second end connected to the second flat horizontal portion of one of the two or more corrugations. In another further aspect, the device further includes a second wire bond having a first end connected to a second bond pad on the semiconductor die and a second end connected to the second flat horizontal portion of another one of the two or more corrugations. In yet a further aspect, the two or more corrugations are electrically isolated from each other. In yet a further aspect, the device further includes encapsulant material between the two or more corrugations and around the semiconductor die and the first and second wire bonds. In another further aspect, the second wire bond is taller than the first wire bond. In yet another aspect of the above embodiment, the two or more corrugations are in a straight line along a first axis. In yet another aspect, the two or more corrugations are staggered from one another in the horizontal plane. In yet another aspect, the two or more corrugations have different heights.

In another embodiment, a method of fabricating a packaged semiconductor device includes attaching a semiconductor die to a flag portion of a lead frame site, wherein the lead frame site includes metal lead fingers connected to the flag portion and each of the metal lead fingers includes two or more corrugations connected to one another, with each corrugation including a first flat portion at one level and a second flat portion at a second level; forming wire bonds between a respective one of bond pads on the semiconductor die and one of the corrugations; encapsulating the lead frame site, wire bonds and semiconductor die; separating the two or more corrugations by removing portions of the metal lead fingers between the flag portion and one of the two or more corrugations, and between adjacent ones of the two or more corrugations. In a further aspect of the above another embodiment, the two or more corrugations are formed by stamping the lead frame site. In another aspect, the separating the two or more corrugations is performed with a patterned etch of the metal lead fingers. In another aspect, the separating the two or more corrugations is performed with at least one of a laser and a saw. In another aspect, a bottom side of the first flat portion is exposed after the encapsulating, and the separating the two or more corrugations includes removing a portion of the first flat portion. In a further aspect, the second level of the second flat portion of one of the two or more corrugations is different than the second level of the second flat portion of another one of the two or more corrugations. In another further aspect, the forming the wire bonds includes forming one of the wire bonds one of the two or more corrugations at a different height that another of the wire bonds on another one of the two or more corrugations.

In yet another embodiment, a packaged semiconductor device includes a semiconductor die attached to a flag portion of a lead frame site, wherein the lead frame site includes metal lead fingers connected to the flag portion and each of the metal lead fingers includes two or more corrugations connected to one another, with each corrugation including a first flat portion at one level and a second flat portion at a second level and each corrugation is electrically isolated from other of the two or more corrugations; wire bonds formed between a respective one of bond pads on the semiconductor die and one of the corrugations; and encapsulating material around the lead frame site, wire bonds and semiconductor die. In one aspect of the above yet another embodiment, one of the wire bonds one of the two or more corrugations is at a different height that another of the wire bonds on another one of the two or more corrugations.

What is claimed is:

1. semiconductor device comprising:
   a lead frame site including a die attach region and corrugated metal leads around the die attach region, wherein each of the corrugated metal leads includes two or more corrugations on a same side of the die attach region, and each of the two or more corrugations includes:
      a first flat horizontal portion,
      a first vertical portion with a first end directly adjacent and connected to a first end of the first flat horizontal portion,
      a second flat horizontal portion with a first end directly adjacent and connected to a second end of the first vertical portion, and
      a second vertical portion with a first end directly adjacent and connected to a second end of the second flat horizontal portion, wherein the first flat horizontal portion is in a different plane than the second flat horizontal portion, wherein the first flat horizontal portion and the second flat horizontal portion belong to a continuous metal part of the corrugated metal lead and have a same thickness; and
   wherein, for each of the corrugated metal leads, the first flat horizontal portions of the two or more corrugations are in a same first plane, and the second flat horizontal portions of the two or more corrugations are in a same second plane.

2. The semiconductor device of claim 1 wherein:
   the corrugated leads are around at least two sides of the die attach region.

3. The semiconductor device of claim 1 further comprising:
   a semiconductor die on the die attach region.

4. The semiconductor device of claim 3 further comprising:

a first wire bond having a first end connected to a first bond pad on the semiconductor die and a second end connected to the second flat horizontal portion of one of the two or more corrugations.

5. The semiconductor device of claim 4 further comprising:
a second wire bond having a first end connected to a second bond pad on the semiconductor die and a second end connected to the second flat horizontal portion of another one of the two or more corrugations.

6. The semiconductor device of claim 5 wherein:
the two or more corrugations are electrically isolated from each other.

7. The semiconductor device of claim 6 further comprising:
encapsulant material between the two or more corrugations and around the semiconductor die and the first and second wire bonds.

8. The semiconductor device of claim 5 wherein:
the second wire bond is taller than the first wire bond.

9. The semiconductor device of claim 1 wherein:
the two or more corrugations are in a straight line along a first axis.

10. The semiconductor device of claim 1 wherein:
the two or more corrugations are staggered from one another in the horizontal plane.

11. The semiconductor device of claim 1 wherein:
the two or more corrugations have different heights.

12. A method of fabricating a packaged semiconductor device comprising:
attaching a semiconductor die to a flag portion of a lead frame site, wherein the lead frame site includes metal lead fingers connected to the flag portion and each of the metal lead fingers includes two or more corrugations connected to one another, with each corrugation including a first flat portion at one level and a second flat portion at a second level in which the first flat portion and the second flat portion belong to a continuous metal part of the metal lead finger and are of a same thickness;
forming wire bonds between a respective one of bond pads on the semiconductor die and one of the corrugations; encapsulating the lead frame site, wire bonds and semiconductor die;
separating the two or more corrugations by removing portions of the metal lead fingers between the flag portion and one of the two or more corrugations, and between adjacent ones of the two or more corrugations.

13. The method of claim 12 wherein the two or more corrugations are formed by stamping the lead frame site.

14. The method of claim 12 wherein the separating the two or more corrugations is performed with a patterned etch of the metal lead fingers.

15. The method of claim 12 wherein the separating the two or more corrugations is performed with at least one of a laser and a saw.

16. The method of claim 12 wherein a bottom side of the first flat portion is exposed after the encapsulating, and the separating the two or more corrugations includes removing a portion of the first flat portion.

17. The method of claim 15 wherein the second level of the second flat portion of one of the two or more corrugations is different than the second level of the second flat portion of another one of the two or more corrugations.

18. The method of claim 15 wherein the forming the wire bonds includes:
forming one of the wire bonds one of the two or more corrugations at a different height that another of the wire bonds on another one of the two or more corrugations.

19. A packaged semiconductor device comprising:
a semiconductor die attached to a flag portion of a lead frame site, wherein the lead frame site includes metal lead fingers connected to the flag portion and each of the metal lead fingers includes two or more corrugations connected to one another, with each corrugation including a first flat portion at one level and a second flat portion at a second level in which the first flat portion and the second flat portion belong to a continuous metal part of the metal lead finger and are of a same thickness and each corrugation is electrically isolated from other of the two or more corrugations;
wire bonds formed between a respective one of bond pads on the semiconductor die and one of the corrugations;
encapsulating material around the lead frame site, wire bonds and semiconductor die.

20. The packaged semiconductor device of claim 19 wherein one of the wire bonds one of the two or more corrugations is at a different height that another of the wire bonds on another one of the two or more corrugations.

21. A semiconductor device comprising:
a lead frame site including a die attach region and corrugated metal leads around the die attach region, wherein each of the corrugated metal leads includes two or more corrugations, and each of the two or more corrugations includes:
a first flat horizontal portion,
a first vertical portion with a first end directly adjacent and connected to a first end of the first flat horizontal portion,
a second flat horizontal portion with a first end directly adjacent and connected to a second end of the first vertical portion, and
a second vertical portion with a first end directly adjacent and connected to a second end of the second flat horizontal portion, wherein the first flat horizontal portion is in a different plane than the second flat horizontal portion, wherein the two or more corrugations are staggered from one another in the horizontal plane.

* * * * *